United States Patent [19]

Nowak et al.

[11] Patent Number: 5,597,668
[45] Date of Patent: Jan. 28, 1997

[54] PATTERNED FILLED PHOTO MASK GENERATION FOR INTEGRATED CIRCUIT MANUFACTURING

[75] Inventors: Edward D. Nowak, Pleasanton; Subhas Bothra, San Jose; David Eatock, Cupertino; Wesley Erck, Danville, all of Calif.

[73] Assignee: VLSI Technology, Inc., San Jose, Calif.

[21] Appl. No.: 504,157

[22] Filed: Jul. 19, 1995

[51] Int. Cl.⁶ ..................................................... G03F 9/00
[52] U.S. Cl. .............................. 430/5; 430/311; 430/312; 430/313; 430/314
[58] Field of Search .............................. 430/5, 311, 312, 430/313, 314

[56] References Cited

U.S. PATENT DOCUMENTS 5,266,446  11/1993  Chang et al. ............................ 430/317

OTHER PUBLICATIONS

S. Wolf, *Silicon Processing for the VLSI Era, vol. 2—Process Integration*, Lattice Press Jun. 1990, pp. 229–236.
D. Webb, S. Sivaram, D. Stark, H. Bath, J. Draina, R. Leggett, and R. Tolles, *Complete Intermetal Planarization Using ECR Oxide and Chemical Mechanical Polish*, Jun. 1992 ISMIC, pp. 141–148.
M. Thomas, P. Rentein, S. Sekigahama and J. Pierce, *Mechanical Planarization Process Characterization*. Mar. 1987.

*Primary Examiner*—S. Rosasco
*Attorney, Agent, or Firm*—Douglas L. Weller

[57] ABSTRACT

The planarity of the dielectric layer over a processing layer is increased by adjustments made to a mask generated for patterning the processing layer. Active circuitry lines are generated for the mask. Also, a fill pattern is generated for the mask. The fill pattern is placed in areas of the mask not filled by the active circuitry lines. The active circuitry lines are combined with the fill pattern to produce a final pattern for the mask. In one embodiment, the fill pattern is generated by first over-sizing the active circuitry lines to form a first pattern. The first pattern is inverted to produce a negative of the first pattern. The negative of the first pattern serves as a marker layer. In addition, a dummy fill pattern is generated. An intersection of the marker layer and the dummy fill pattern is performed to produce an unsized fill pattern. Areas which have widths smaller than a predetermined minimum width and areas which have heights smaller than a predetermined minimum height are eliminated from the unsized fill pattern to produce the final fill pattern. The union of the original active circuitry lines and the final fill pattern forms a composite pattern for the photomask.

18 Claims, 7 Drawing Sheets

5,597,668

PATTERNED FILLED PHOTO MASK GENERATION FOR INTEGRATED CIRCUIT MANUFACTURING

BACKGROUND

The present invention concerns the field of integrated circuit manufacturing and pertains particularly to generation of masks with patterned fill.

When processing integrated circuits, masks are utilized to pattern and etch layers of material deposited on a wafer. These layers are composed of, for example, polysilicon, metal or oxide.

The trend in integrated circuit manufacturing is to increase the amount of circuitry within each individual integrated circuit. Along with this trend there is an increase in the number of layers used and a decrease in the dimensions of the patterned material.

The planarity of topology underlying a deposited layer of material can have a significant impact on the ability to pattern and etch the deposited layer. As the numbers of layers increase and the dimensions of the patterns decrease, the planarity of topology underlying some layers, particularly the interconnect layers such as polysilicon layers and metal layers, can be significantly affected. Each additional interconnect layer increases the variation in step heights for the interconnect layers above. However, when patterning and etching these top interconnect layers, the depth of focus for high resolution photolithograpic step and exposure systems used to pattern these top layers limits the amount of planar variation in the underlying topology that can be tolerated.

Various methods have been used to increase planarization in topology. For example, a spin-on glass (SOG)/etchback process can be used. In the SOG/etchback process, after patterning and etching certain layers, spin on glass flows over the wafer filling narrow gaps. SOG/etchback is a cost effective method to improve local planarization of the layer. See, for example, S. Wolf, Silicon Processing for the VLSI Era, Vol. 2—Process Integration, Lattice Press 1990, pp. 229–236. While effective for filling narrow gaps, this SOG/etchback process is ineffective in reducing height differences between dense regions having a lot of circuitry and open regions including little or no circuitry.

Another method used to increase planarity is a chemical mechanical polishing process used after deposition of dielectric layers. See for example, D. Webb, S. Sivaram, D. Stark, H. Bath, J. Draina, R. Leggett, and R. Tolles, Complete Intermetal Planarization Using ECR Oxide and Chemical Mechanical Polish, 1992 ISMIC, pp. 141–148. However, this method has not proved cost-effective.

SUMMARY OF THE INVENTION

In accordance with the preferred embodiment of the present invention, a method is presented for increasing planarity of a processing layer of an integrated circuit when used with the SOG/etch planarization method. The planarity of the processing layer is increased by adjustments made to a mask generated for patterning the processing layer. Active circuitry lines are generated for the mask by the circuit designers. Also, a fill pattern is generated for the mask. The fill pattern is placed in areas of the mask not filled by the active circuitry lines. The active circuitry lines are combined with the fill pattern to produce a final pattern for the mask.

In the preferred embodiment, the fill pattern is generated by first over-sizing the active circuitry lines to form a first pattern. For example, the active circuitry lines are over-sized by 0.75 microns in each direction of height and width. The first pattern is inverted to produce a negative of the first pattern. The negative of the first pattern serves as a marker layer.

In addition, a dummy fill pattern is generated. The dummy fill pattern may be any shape. In one embodiment, a pattern of rectangular lines is used. Alternately a herring bone pattern or other shapes may be used. In the preferred embodiment, the rectangular lines are approximately one micron by approximately ten microns. Spacing between the rectangular lines is approximately 0.75 microns.

An intersection of the marker layer and the dummy fill pattern is performed to produce an unsized fill pattern. Areas which have widths smaller than a predetermined minimum width and areas which have heights smaller than a predetermined minimum height are eliminated from the unsized fill pattern to produce the final fill pattern. In the preferred embodiment, minimum height and width are the same. A union of the final pattern with the active circuitry lines forms a composite pattern for the photomask.

The present invention allows for global planarization of processing layers in an integrated circuit manufacturing process. The global planarization is achieved in a cost effect manner without violating circuit design rules.

DESCRIPTION OF THE PREFERRED EMBODIMENT

In the preferred embodiment of the present invention, a fill pattern is added to the active circuitry lines of a mask in order to improve global planarization. For example, a dielectric layer between a polysilicon layer and a first metal layer is planarized to facilitate pattern and etch of the first metal layer placed over the polysilicon layer. Likewise, a dielectric layer between the first metal layer and a second metal layer is planarized to facilitate pattern and etch of the second metal layer placed over the first metal layer.

Planarization is achieved by placing a fill pattern on a mask for the layer that is to be planarized. In the preferred embodiment of the present invention, the fill pattern has the following characteristics. The fill pattern is made up of lines (called fill lines) and spaces comparable to those found on the circuit. Therefore, the spaces between geometries on the same layer throughout the circuit are fairly consistent. Design rules for circuitry are not violated. The fill lines are discontinuous at intervals to minimize the possibility of shorts.

Figure 1:
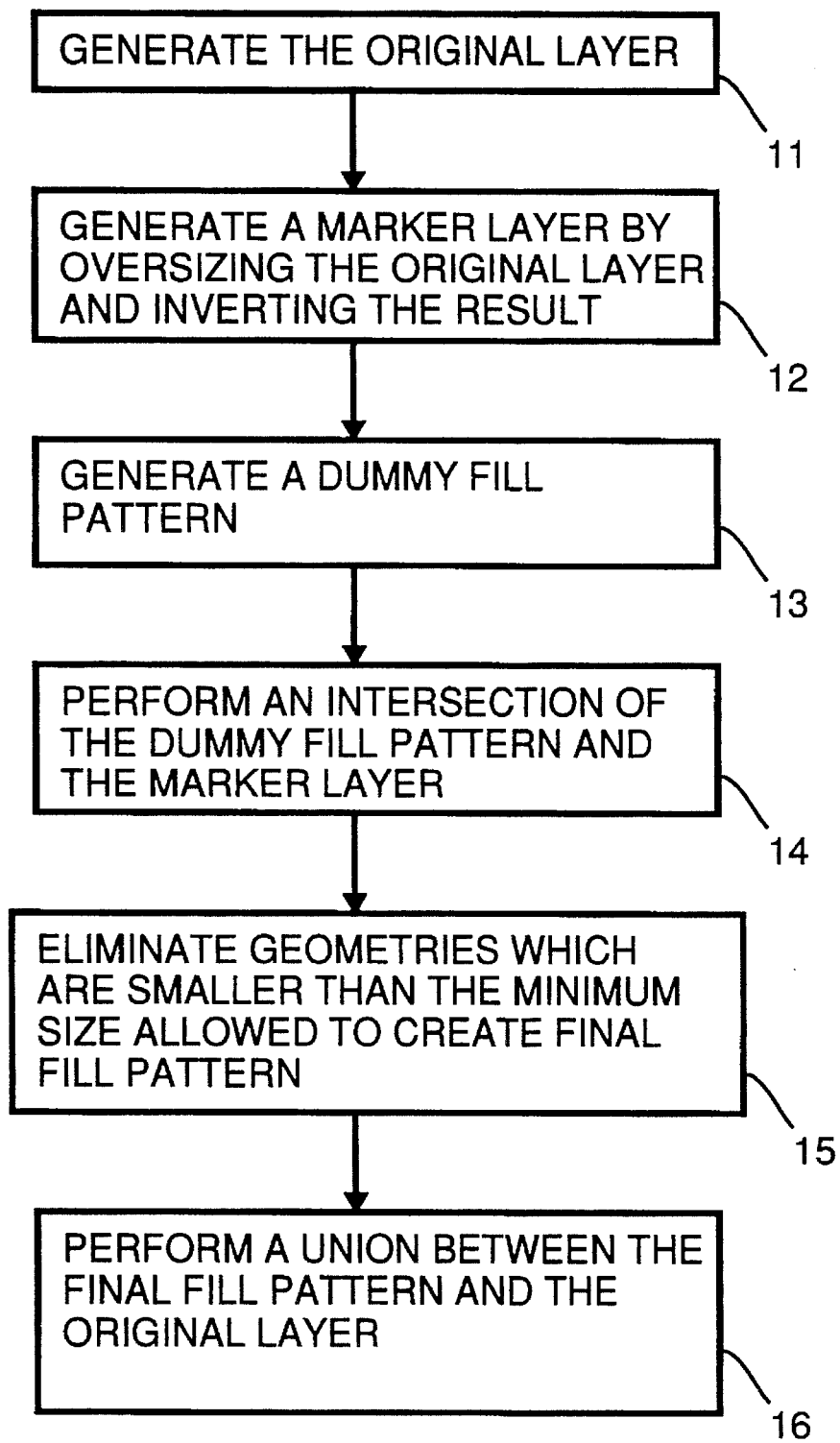
FIG. 1 is a flowchart which summarizes steps to generate pattern fill in accordance with a preferred embodiment of the present invention.

FIG. 1 is a flowchart which summarizes steps to generate a pattern filled mask in accordance with the preferred embodiment of the present invention. In a step 11, an active layer consisting of active circuitry lines is generated for a mask in Manufacturing Electron Beam Exposure System (MEBES) format available from Etec Corporation of Hayward, California. This is done, for example, using generation software, such as Computer Aided Transcription System (CATS) available from Transcription Enterprises, Limited, having a business address of 105 Albright Way, Los Gatos, Calif. 95030. The active circuitry lines determine the pattern of a mask resulting from implementation of a circuit design before a fill pattern is added.

Figure 2:
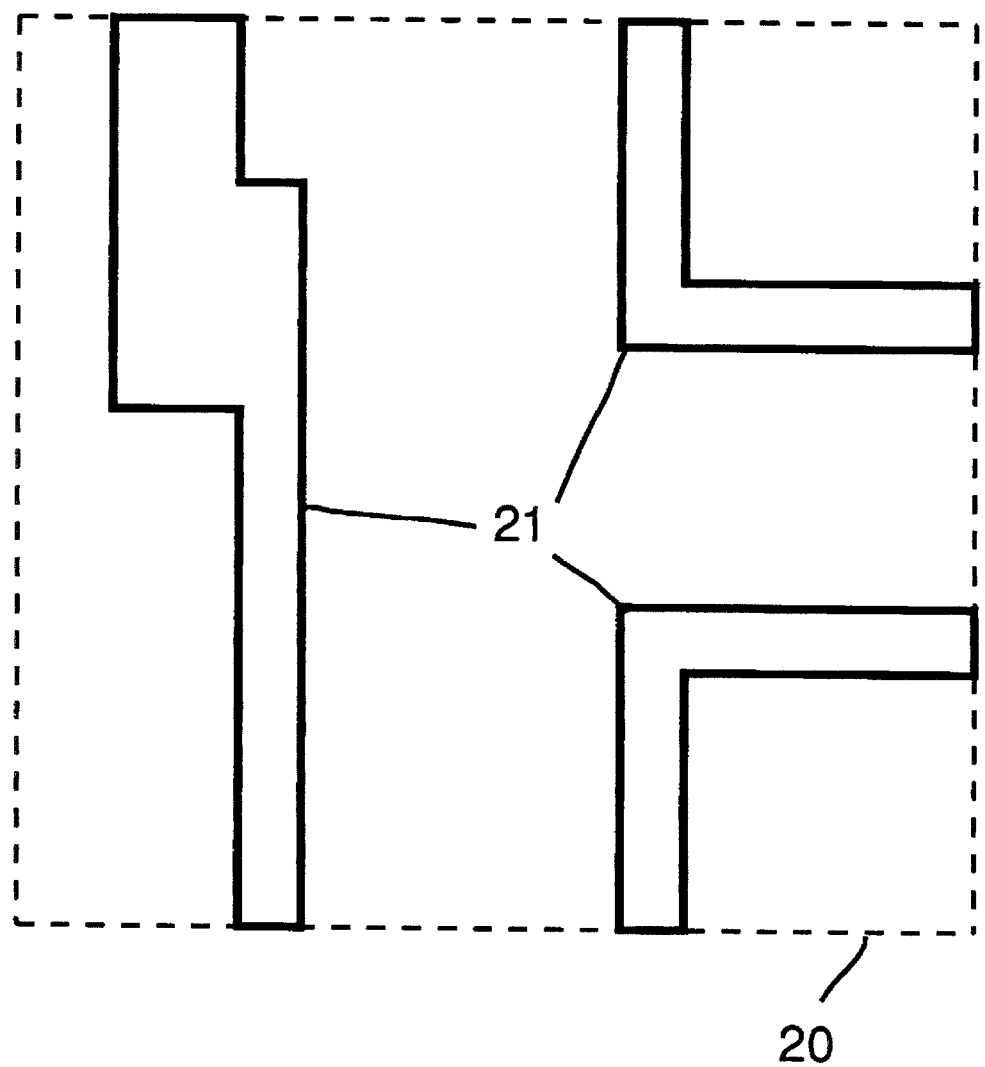
FIG. 2 shows active circuitry lines on a portion of a mask, the mask being used to pattern a processing layer in an integrated circuit manufacturing process in accordance with a preferred embodiment of the present invention.

For example, FIG. 2 shows a portion 20 of a pattern for a mask. The pattern includes active circuitry lines 21.

In a step 12, a marker layer is generated to mark areas on the mask to receive the fill pattern. The marker layer is generated by oversizing the active circuitry lines. For example, 0.75 microns is added in each direction to the width and to the height of each active circuitry line. After oversizing the active circuitry lines, the result is inverted to produce a negative of the pattern of the oversized active circuitry lines. The marker layer marks areas to be filled.

Figure 3:
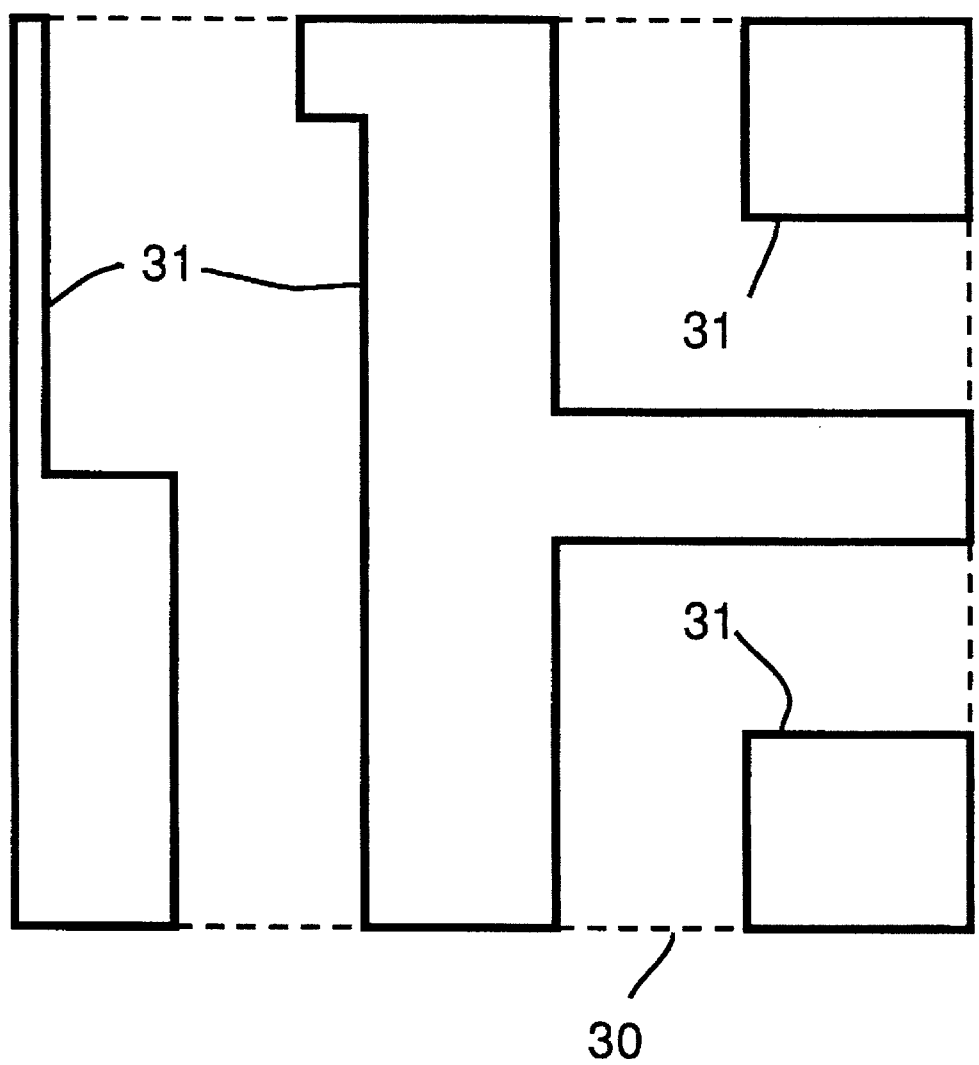
FIG. 3 shows a marker pattern generated by oversizing and then inverting the active circuitry lines shown in FIG. 2, in accordance with a preferred embodiment of the present invention.

For example, FIG. 3 shows a portion 30 of a marker layer for the mask. The pattern includes marked areas 31.

In a step 13, a dummy fill pattern is generated, for example using a layout editor or an automated pattern generator. For example, the dummy fill pattern is composed of rectangles (fill lines) of predetermined length and width. For example, the width of each rectangle is one micron and the height of each rectangle is ten microns. The rectangles are repeated at a predetermined spacing. For example, the spacing between the rectangles is 0.75 microns in both the horizontal and the vertical directions. Other pattern shapes also may be used. For example, in an alternate embodiment, a herring bone pattern is used.

Figure 4:
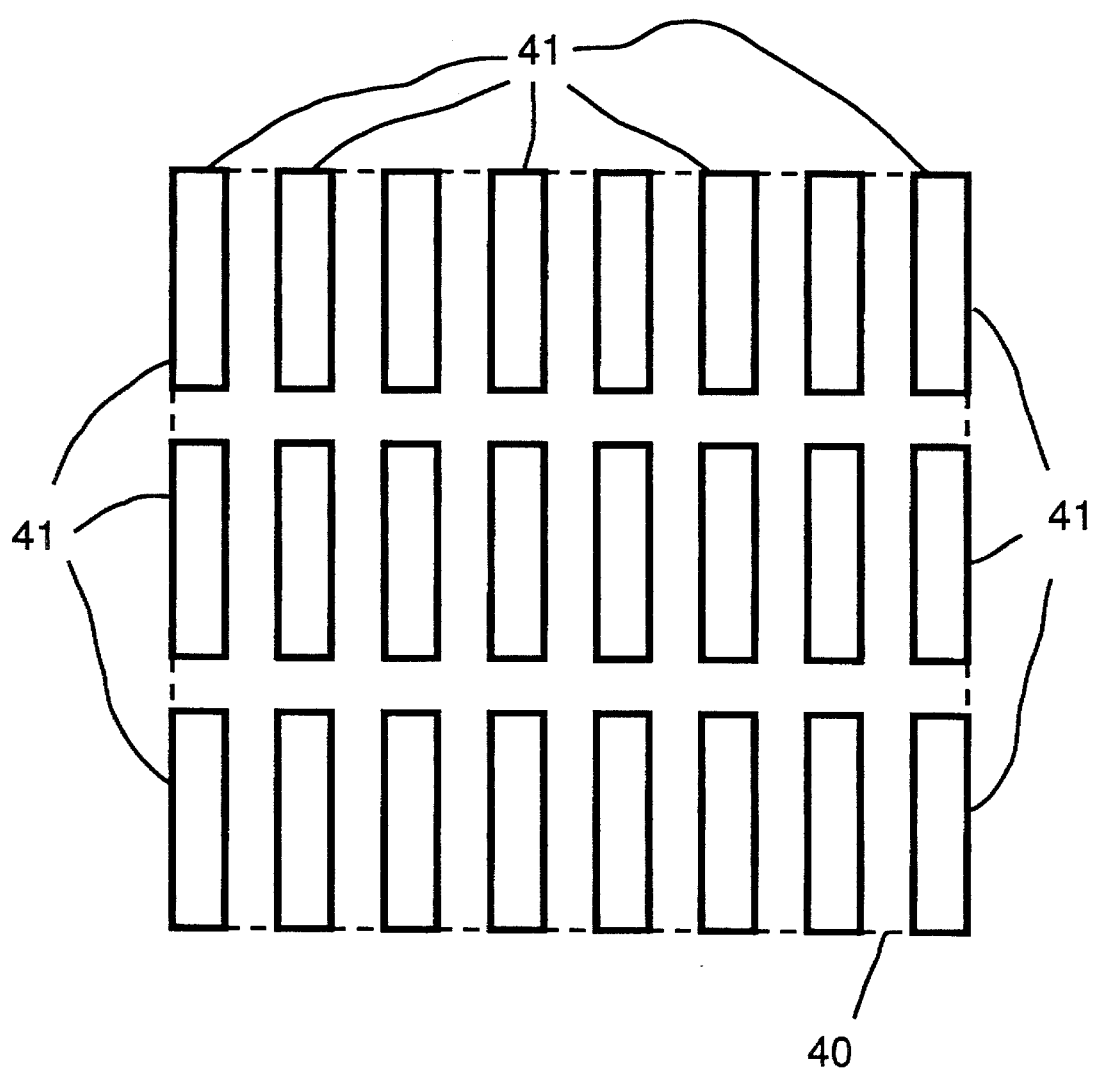
FIG. 4 shows a dummy fill pattern generated using a layout editor or an automated pattern generator, in accordance with the preferred embodiment of the present invention.

For example, FIG. 4 shows a portion 40 of a dummy fill pattern. The dummy fill pattern is composed of rectangles 41, as shown.

In a step 14, an intersection (logic AND) is performed of the marker layer generated in step 12 with the dummy fill pattern generated in step 13. The intersection is done without attempting to align the dummy fill pattern with the active circuitry lines. The resulting unsized fill pattern may contain geometries which are smaller than the minimum size allowed by design rules.

Figure 5:
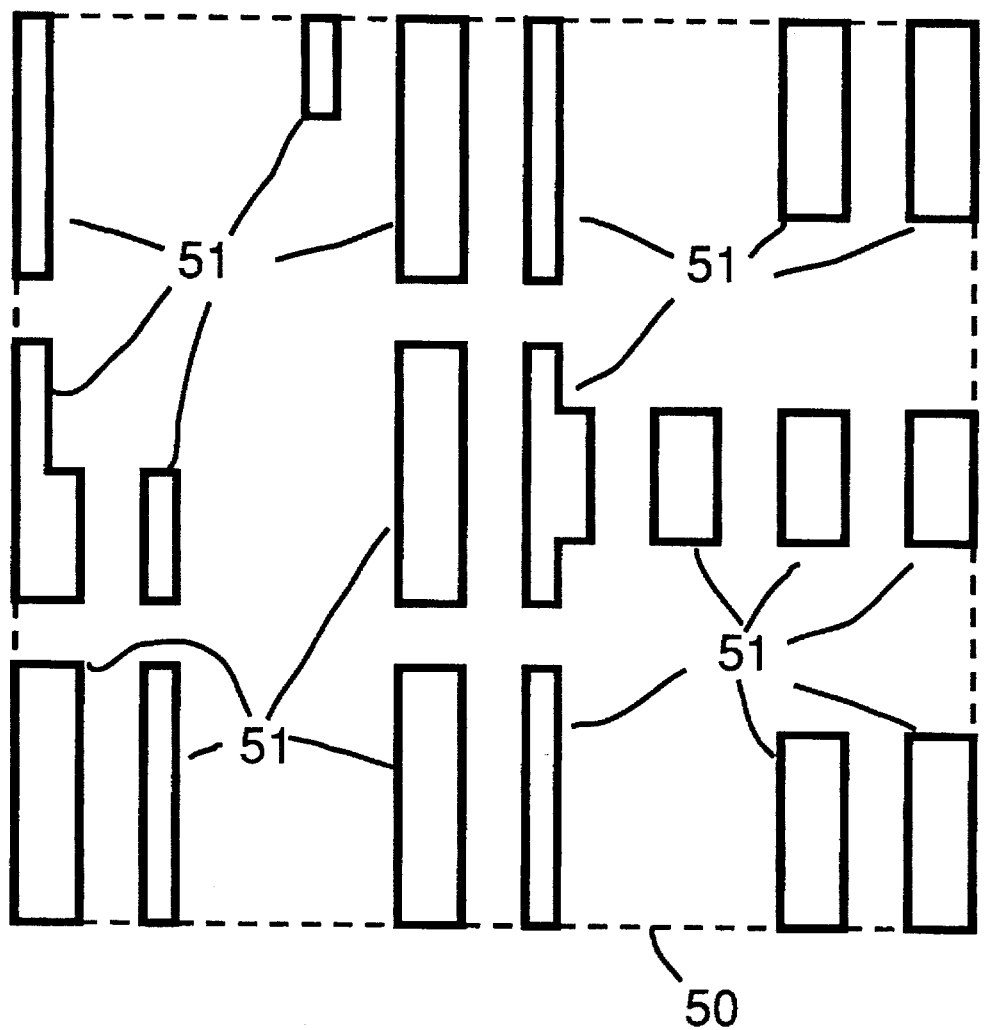
FIG. 5 shows an unsized fill pattern resulting from an intersection of the marker pattern shown in FIG. 2 with the dummy fill pattern shown in FIG. 4, in accordance with the preferred embodiment of the present invention.

For example, FIG. 5 shows a portion 50 of the unsized fill pattern described above. The unsized fill pattern includes rectangles and rectangle portions 51 remaining after intersection. Step 14, for example, is also used to clip the size of the fill pattern when the dummy fill pattern covers an area larger than the area covered by the mask.

In a step 15, the unsized fill pattern created in step 14, is negatively sized to eliminate geometries which are smaller than the minimum size allowed by design rules. The result is then resized an equal amount to restore the remaining geometries to their unsized dimensions. For example, areas that have widths or heights smaller than 1.00 microns are removed. The resulting pattern is the pattern fill to be used on the mask.

Figure 6:
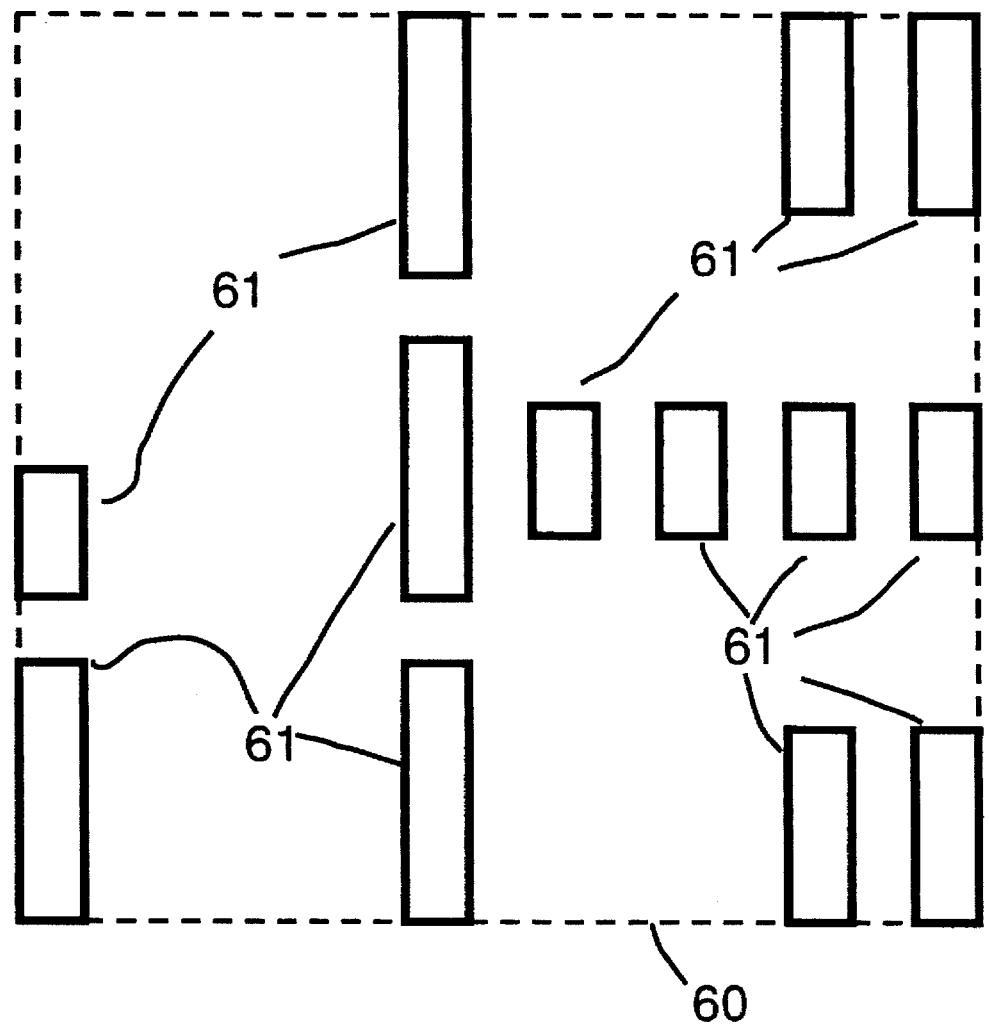
FIG. 6 shows a final fill pattern resulting from eliminating undersized geometries from the unsized fill pattern shown in FIG. 5, in accordance with the preferred embodiment of the present invention.

For example, FIG. 6 shows a portion 60 of the pattern fill resulting from the performance of step 15. The pattern fill shapes 61 will be used to provide fill for the mask.

In a step 16, a union (logic OR) of the active circuitry lines of the active layer generated in step 11 and the pattern fill shapes of the pattern fill generated in step 15 is performed. The results of this union is the completed mask layer definition and defines the pattern on the mask used for patterning the layer of material used in integrated circuit manufacturing.

Figure 7:
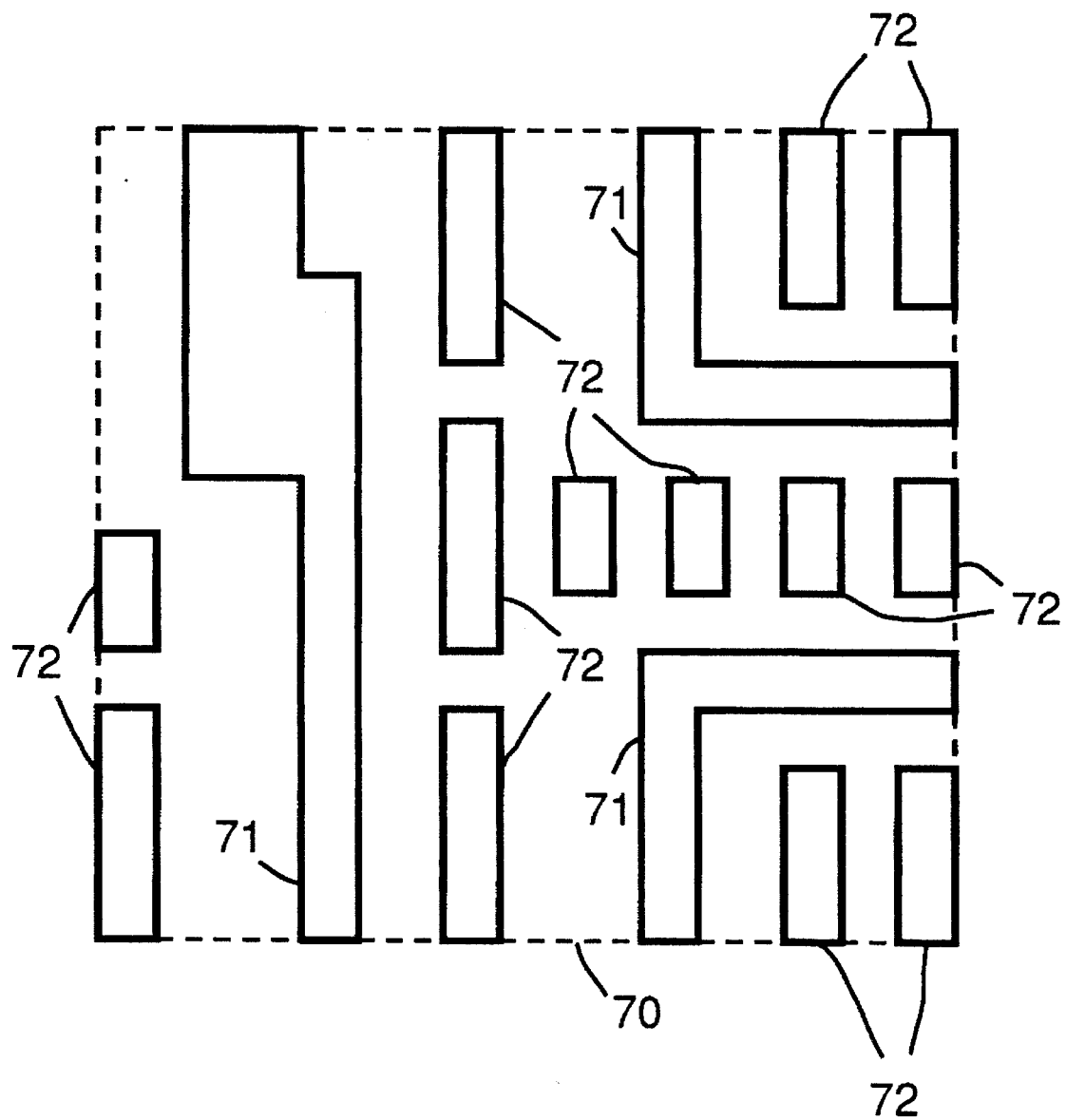
FIG. 7 shows a final pattern which is a union of the final fill pattern shown in FIG. 6 and the active circuitry lines shown in FIG. 2, in accordance with the preferred embodiment of the present invention.

For example, FIG. 7 shows a portion 70 of the pattern of the completed mask layer definition. The pattern of the completed mask layer definition includes active circuitry lines 71 and a fill pattern 72.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for increasing planarity of a processing layer of an integrated circuit, the method comprising the following step:

(a) generating a mask for the processing layer, including the following substeps,
    (a.1) generating active circuitry lines for the mask,
    (a.2) generating a fill pattern for the mask, the fill pattern being placed in areas of the mask not filled by the active circuitry lines, and
    (a.3) performing a union of the active circuitry lines generated in substep (a.1) and the fill pattern generated in substep (a.2) to produce a final pattern for the mask.

2. A method as in claim 1 wherein substep (a.2) includes the following substeps:

(a.2.1) over-sizing the active circuitry lines to form a first pattern;
  (a.2.2) inverting the first pattern to produce a negative of the first pattern, the negative of the first pattern serving as a marker layer;
  (a.2.3) generating a dummy fill pattern;
  (a.2.4) performing an intersection of the marker layer and the dummy fill pattern to produce an unsized fill pattern; and,
  (a.2.5) eliminating from the unsized fill pattern, areas which have widths smaller than a predetermined minimum width and areas which have heights smaller than a predetermined minimum height.

3. A method as in claim 2 wherein in substep (a.2.3) the dummy fill pattern is comprised of rectangular lines.

4. A method as in claim 3 wherein the rectangular lines are approximately one micron by approximately ten microns, the rectangular lines being separate from each other by approximately 0.75 microns.

5. A method as in claim 2 wherein in substep (a.2.1) the active circuitry lines are over-sized by 0.75 microns in each direction of height and width.

6. A method as in claim 2 wherein in substep (a.2.3) the dummy fill pattern is a herringbone shaped pattern.

7. A method for producing a mask for use in patterning a processing layer of an integrated circuit, the method comprising the following steps:

(a) generating active circuitry lines for the mask;

(b) generating a fill pattern for the mask, the fill pattern being placed in areas of the mask not filled by the active circuitry lines; and (c) combining the active circuitry lines generated in substep (a) with the fill pattern generated in substep (b) to produce a final pattern for the mask.

8. A method as in claim 7 wherein substep (b) includes the following substeps:

(b.1) over-sizing the active circuitry lines to form a first pattern;

(b.2) inverting the first pattern to produce a negative of the first pattern, the negative of the first pattern serving as a marker layer;

(b.3) generating a dummy fill pattern;

(b.4) performing an intersection of the marker layer and the dummy fill pattern to produce an unsized fill pattern; and, (b.5) eliminating from the unsized fill pattern, areas which have widths smaller than a predetermined minimum width and areas which have heights smaller than a predetermined minimum height.

9. A method as in claim 8 wherein in substep (b.3) the dummy fill pattern is comprised of rectangular lines.

10. A method as in claim 9 wherein in substep (b.3) the rectangular lines are approximately one micron by approximately ten microns, the rectangular lines being separate from each other by approximately 0.75 microns.

11. A method as in claim 8 wherein in substep (b.1) the active circuitry lines are over-sized by 0.75 microns in each direction of height and width.

12. A method as in claim 8 wherein in substep (b.3) the dummy fill pattern is a herringbone shaped pattern.

13. A method for producing a mask for use in patterning a processing layer of an integrated circuit, the method comprising the following steps:

(a) generating active circuitry lines for the mask;

(b) over-sizing the active circuitry lines to form a first pattern;

(c) inverting the first pattern to produce a negative of the first pattern, the negative of the first pattern serving as a marker layer;

(d) generating a dummy fill pattern;

(e) performing an intersection of the marker layer and the dummy fill pattern to produce an unsized fill pattern; and, (f) producing a fill pattern for the mask by eliminating from the unsized fill pattern, areas which have widths smaller than a predetermined minimum width and areas which have heights smaller than a predetermined minimum height.

14. A method as in claim 13 additionally comprising the step of:

(c) performing a union of the active circuitry lines generated in step (a) and the fill pattern generated in step (f) to produce a final pattern for the mask.

15. A method as in claim 13 wherein in step (d) the dummy fill pattern is comprised of rectangular lines.

16. A method as in claim 15 wherein in step (d) the rectangular lines are approximately one micron by approximately ten microns, the rectangular lines being separate from each other by approximately 0.75 microns.

17. A method as in claim 13 wherein in step (b) the active circuitry lines are over-sized by 0.75 microns in each direction of height and width.

18. A method as in claim 13 wherein in step (d) the dummy fill pattern is a herringbone shaped pattern.

\* \* \* \* \*